United States Patent
Jex et al.

(10) Patent No.: US 6,549,031 B1
(45) Date of Patent: Apr. 15, 2003

(54) POINT TO POINT ALTERNATING CURRENT (AC) IMPEDANCE COMPENSATION FOR IMPEDANCE MISMATCH

(75) Inventors: Jerry G. Jex, Olympia, WA (US); Arnaud Forestier, Federal Way, WA (US); Kersi Vakil, Olympia, WA (US); Abhimanyu Kolla, Tacoma, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/002,418

(22) Filed: Nov. 13, 2001

(51) Int. Cl.[7] .................................................. H03K 17/16

(52) U.S. Cl. ............................. 326/30; 326/82; 333/32

(58) Field of Search ................................ 326/30, 82, 83; 333/17.3, 32, 22 R

(56) References Cited

U.S. PATENT DOCUMENTS 5,781,029 A * 7/1998 Baran ......................... 326/30
6,316,957 B1 * 11/2001 Ang et al. ................... 326/30

FOREIGN PATENT DOCUMENTS

JP          2000241451 A * 9/2000 .......... G01R/1/073

* cited by examiner

*Primary Examiner*—Michael Tokar
*Assistant Examiner*—James H Cho
(74) *Attorney, Agent, or Firm*—Blakely, Sokoloff, Taylor & Zafman LLP

(57) ABSTRACT

Point-to-point AC impedance compensation calculates and matches AC impedance for integrated circuit input and output buffers, taking into consideration impedances of printed circuit boards, connectors, cards, cables, and/or other interfaces on a computer bus, upon computer system power-up or on demand during operation using no additional package pins or traces in the printed circuit board, connector, card, or cable.

22 Claims, 3 Drawing Sheets

POINT TO POINT ALTERNATING CURRENT (AC) IMPEDANCE COMPENSATION FOR IMPEDANCE MISMATCH

BACKGROUND OF THE INVENTION

1. Field of the Invention

The present invention relates to integrated circuits. In particular, the present invention relates to impedance compensation for bus devices.

2. Background Information

For purposes of illustrating the concept of impedance compensation, suppose that a transmitting integrated circuit, which has a driver (or output buffer), is mounted on a printed circuit board and the printed circuit board has a connector, perhaps to plug into a slot on a computer's motherboard. The printed circuit board or other cards also may have their own connectors, slots, and/or cables as interconnections. The transmitting integrated circuit package is mounted on the printed circuit board using solder and wires. The driver (or output buffer) is included on the integrated circuit and is connected to other components on the integrated circuit during the integrated circuit manufacturing process (e.g., etching). Suppose further that a receiving integrated circuit, similar to the transmitting integrated circuit has a receiver (or input buffer) is mounted to a card or other printed circuit board, which also has a connecter that plugs into a slot on the motherboard. The slots on the motherboard for the transmitting and receiving printed circuit boards are connected to each other via a cable.

Any of the connections on the cards, printed circuit boards, cables, slots, and integrated circuits may be connected to one or more buses, which have individual traces. Each trace may be connected to pins, wires, solder connections, etc., on any of the cards, printed circuit boards, cables, slots, or integrated circuits.

Each interface between the output buffer, transmitting package, printer circuit boards, connectors, cable, card, receiving package, and/or input buffer has the potential to introduce "impedance discontinuities" or "impedance mismatches" because the impedances of each component on each side of the connection are not equivalent. Although many of the interfaces may be matched in the design of the computer system or manufacture of the integrated circuits, manufacturing variations around as little as plus or minus ten percent can cause impedance mismatches between interfaces. Tighter manufacturing tolerances, to compensate for variations in temperature, voltage and process, for example, are sometimes available, but are costly.

Impedance mismatch produces "reflections," which cause noise, ringing, etc., at high frequencies. The noise can intermingle with the signal being transmitted such that the signal becomes distorted, especially when using low signal voltages whose noise tolerance is low. Reflections also add or subtract with the transmitted signal and may cause bus signal integrity benefit or degradation, depending upon bus trace length, clock frequency, and other parameters. These effects can create, among other things, a limitation in the maximum frequency that can be propagated electrically on the bus.

Correcting impedance mismatches and reducing reflections improves signal integrity and provides more noise margin. One known way to compensate for impedance mismatches between input buffers and output buffers is to adjust output buffer direct current (DC) impedance against a fixed resistor to match the target input buffer impedance, as described in U.S. Pat. No. 6,199,563 to Volk et al. One known compensation scheme to compensate for impedance discontinuities in printed circuit boards involves setting the acceptable impedance mismatch tolerances to be uniform across bus signals. This may be accomplished by running all bus traces on the same printed circuit board layer, which reduces bit-to-bit impedance variations caused by impedance mismatch between layers. These schemes are limited in that, among other things, they do not take into consideration alternating current (AC) impedance, or impedance discontinuities across connectors, printed circuit board, cards, and/or cables.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF THE ILLUSTRATED EMBODIMENTS

An AC impedance compensation process and system is described in detail herein. Various aspects of the invention are described as well. However, it will be apparent to those skilled in the art that the invention may be practiced with only some or all aspects of the invention. For purposes of explanation, specific numbers, methods, materials and configurations are set forth in order to provide a thorough understanding of the invention. However, it will also be apparent to one skilled in the art that the invention may be practiced without the specific details. In other instances, well-known features are omitted or simplified in order not to obscure the invention.

Some parts of the description will be presented using terms such as particular signals, impedances, buffers (e.g., drivers and receivers), processors, state machines, and so forth, commonly employed by those skilled in the art to convey the substance of their work to others skilled in the art. Other parts of the description will be presented in terms of operations performed by a computer system, using terms such as accessing, determining, counting, transmitting, and so forth. As is well understood by those skilled in the art, these quantities and operations take the form of electrical, magnetic, or optical signals capable of being stored, transferred, combined, and otherwise manipulated through mechanical and electrical components of a computer system; and the term "computer system" includes general purpose as well as special purpose data processing machines, systems, and the like, that are standalone, adjunct or embedded.

Various operations will be described as multiple discrete actions performed in turn in a manner that is most helpful in understanding the invention. However, the order in which they are described should not be construed to imply that these operations are necessarily order dependent or that the operations be performed in the order in which the operations are presented.

The invention is described below in further detail with respect to several examples for illustration. Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
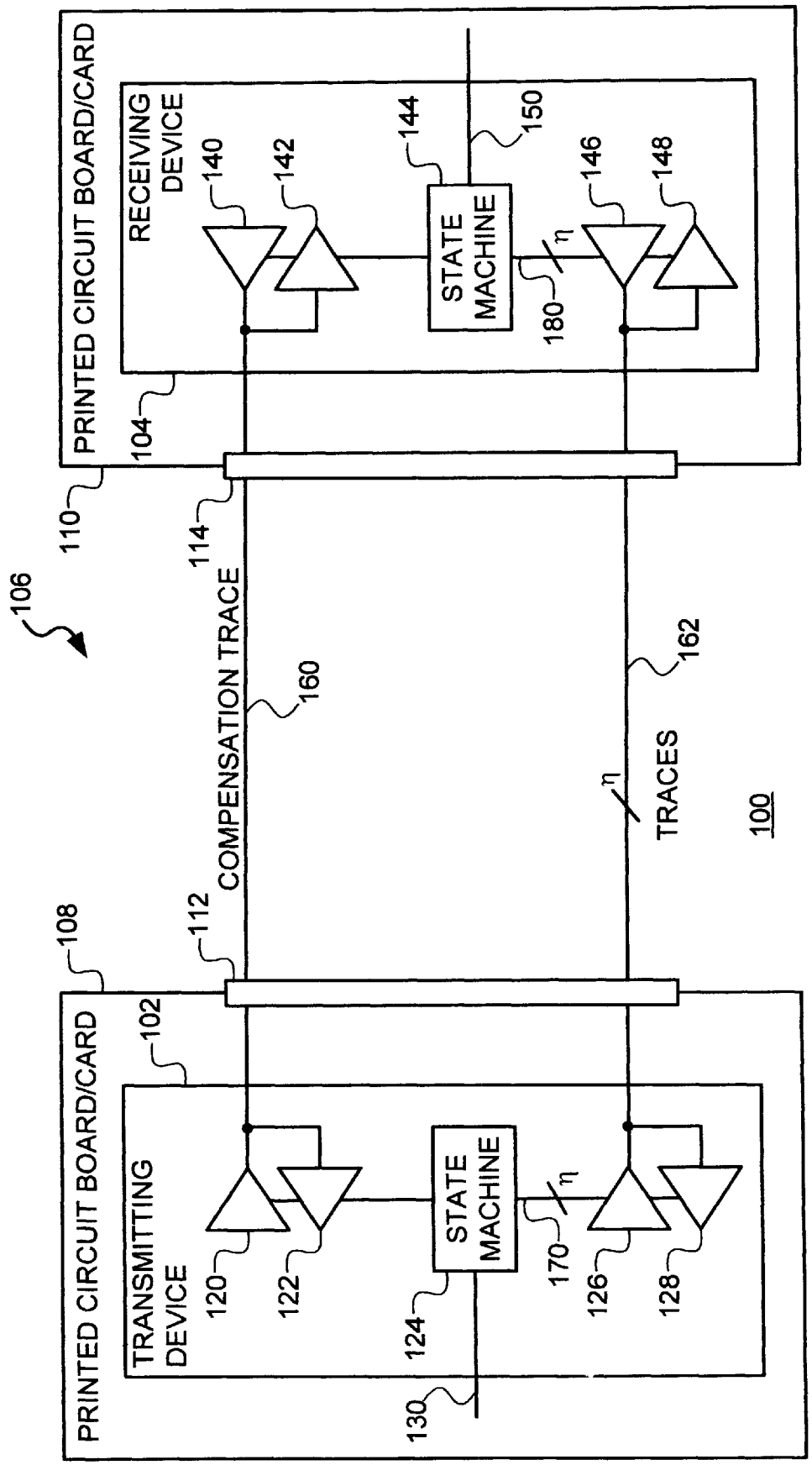
FIG. 1 is a schematic diagram of an example transmission system suitable for implementing embodiments of the present invention.

FIG. 1 shows an example transmission system 100, which includes a device 102 and a device 104 coupled to each other via a bus 106. The device 102 and the device 104 each transmit and receive signals (e.g., data, control, addresses) via the bus 106. (Buses are commonly classified into three functional groups: data bus, control bus, and address bus.)

In one embodiment, the bus 106 may be an input/output (I/O) bus, which connects I/O devices such as graphics controllers and printers to each other. In this case, the devices 102 and 104 represent I/O devices.

Alternatively, the bus 106 may be a processor-memory bus, which connects processors and memories to each other. In this case, the devices 102 and 104 represent processors and memory devices.

Alternatively still, the bus 106 may be a system or backplane bus, which connects processors, memories, and I/O devices together via an interconnection structure ("backplane") within the computer system that processor boards, memory boards, and I/O boards plug into for communication with each other. In this case, the devices 102 and 104 represent devices mounted on boards 108 and 110, which may be I/O, processor, and/or memory boards or cards. The boards 108 and 110 may have connectors 112 and 114, respectively, that plug into a backplane. Physically, part of the bus 106 may be a cable to couple the boards 108 and 110 to each other via the connectors 112 and 114. Of course, other bus configurations are possible.

Of course, while only two devices are shown, the bus 106 commonly has many devices connected to it. However, the present invention is limited to point-to-point buses that have only two devices actively connected to each other. The present invention does not address signal integrity issues introduced by multiple stubs on high speed buses.

The bus 106 includes several separate lines, wires, or traces, each of which is assigned a particular meaning or function, e.g., data bus lines, address bus lines, and control bus lines. In the embodiment shown, the bus 106 includes a data bus comprised of several traces, which pass through the device 102 and 104 packaging, the printed circuit boards/cards 108 and 110 layers, the connectors 112 and 114, and cables (not shown).

Also in embodiment shown in FIG. 1, the device 102 includes a compensation driver 120, a compensation receiver 122, a state machine 124, a control driver 126, a control receiver 128, and an enable pin 130. The device 104 includes a compensation driver 140, a compensation receiver 142, a state machine 144, a control driver 146, a control receiver 148, and an enable pin 150. The compensation driver 120 is coupled to the compensation receiver 140 via a compensation trace 160. The control driver 126 is coupled to the control receiver 146 via one or more of the remaining traces 162 of the bus 106.

The devices 102 and optionally 104 adjust impedance values in the transmission system 100 to match impedance with other components in the transmission system 100. For example, if a printed circuit board 108 or 110 has a nominal tolerance of minus five percent, the driver 120 adjusts its impedance to a nominal value of minus five percent. Alternatively, if the impedance tolerance of the printed circuit board 108 is plus three percent, the impedance tolerance of the connector 112 is plus five percent, and the impedance tolerance of the cable (not shown) is minus one percent, the impedance of the driver 120 and the receiver 142 may be adjusted to a suitable tolerance value based on an algorithm to reduce reflections (e.g., to a two percent tolerance).

There are control lines 170 and 180 coupled to other I/O blocks on the bus 106 to adjust the associated driver/receiver impedance values. Signals on the control lines 170 and 180 may drive and read from the other I/O blocks on the bus 106. In one embodiment, the control lines 170 and 180 may be arranged as a serial shift register array to reduce the number of traces utilized. In an alternative embodiment, the control lines 170 and 180 may be part of a control bus portion of the bus 106.

In one embodiment, there is a separate package pin and signal trace dedicated for the enable pins 130 and 150 and the compensation trace 160, respectively. In the embodiment shown in FIG. 1, the compensation trace 160 is one of the traces in the bus 106.

In the embodiment shown in FIG. 1, the compensation trace 160 is identical to the other traces in the bus 106 except that it may have the compensation driver 120 and the compensation receiver 142 at the trace ends. For example, the compensation trace 160 may have the same layer, pitch, length, orientation, and reference plane as other traces in the bus 106. The drivers 120, 126, 140, and 146 are similar to well-known bus drivers. The receivers 128 and 148 are similar to well-known bus receivers. The receivers 122 and 142 may be specific to the sampling schemes described below.

The state machines 124 and 144 are any well-known devices that store a status of a parameter at a given time and changes the status based on an input. In one embodiment, the state machines 124 and 144 store values representing impedances in the transmission system 100 and output new impedance values based on feedback from down stream or upstream devices on the bus.

Figure 2:
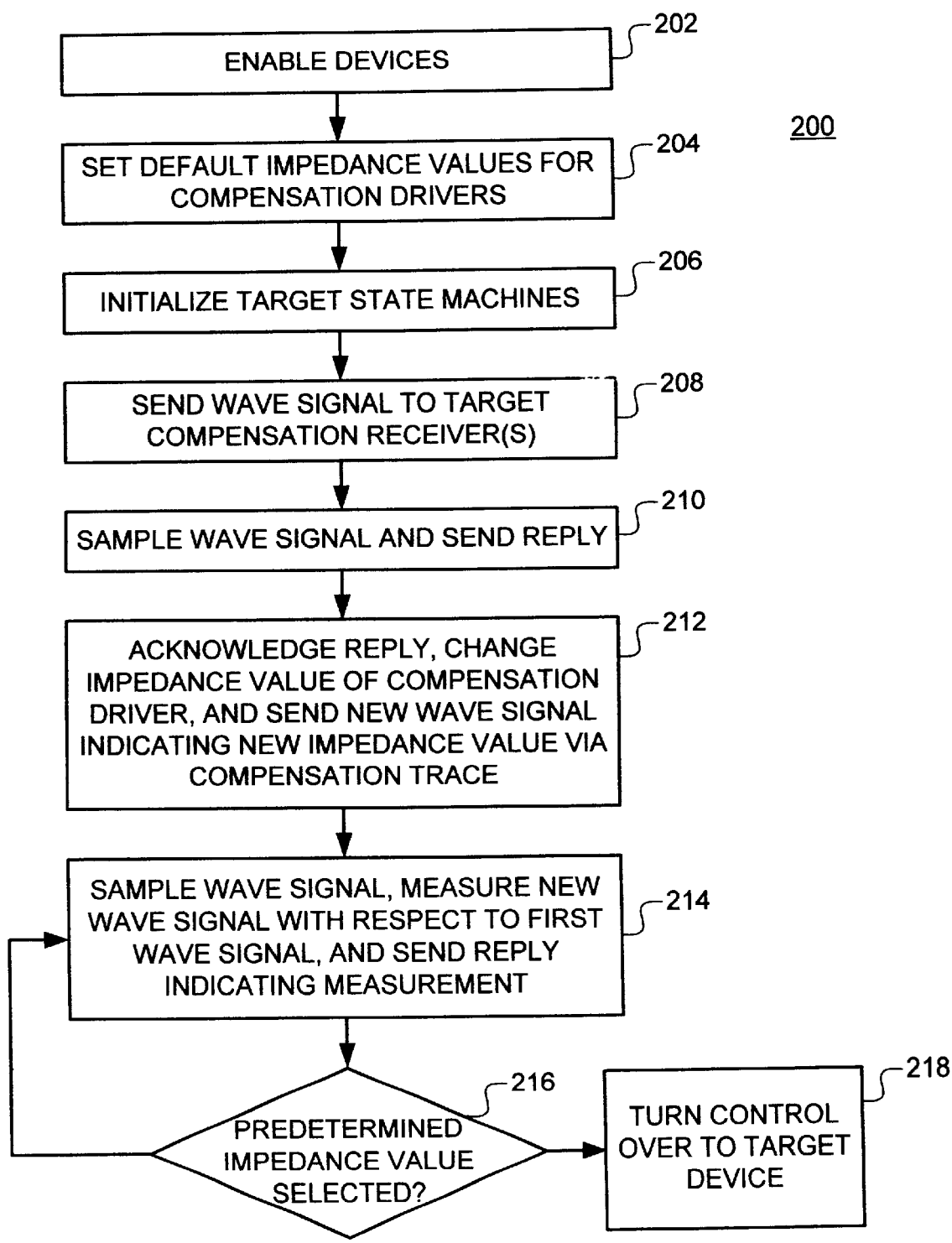
FIG. 2 is a flowchart illustrating an example approach to AC impedance compensation process for the transmission system shown in FIG. 1 according to an embodiment of the present invention.

A signal on the enable pins 130 and 150 triggers a compensation process, portions of which are embedded in the state machines 124 and 144. FIG. 2 is a flowchart illustrating an example AC impedance compensation process 200 for the transmission system 100 according to an embodiment of the present invention.

In a block 202, the devices on the bus to be AC impedance matched are enabled. In one embodiment, a signal is asserted on the enable pins 130 and 150 during the transmission system 100 power up to enable the devices. In an alternative embodiment, the transmission system 100 is powered up and a signal is asserted on the enable pins 130 and 150 during operation of the transmission system 100 to enable the devices. Alternatively still, the transmission system 100 is powered up and a signal is asserted on the enable pins 130 and 150 in response to a "reset" signal the transmission system 100 to enable the devices.

In a block 204, default impedance values are set for the compensation drivers. In one embodiment, default impedance values are set for the compensation drivers 120 and 140, and any other I/O drivers of interest.

In a block 206, the transmitting state machine initializes other state machines, on the bus. In one embodiment, the devices 102 and 104 give control of the data bus portion of the bus 106 to the state machines 124 and 144. The state machine 124 transmits a data sequence to the state machine 144 (through the control driver 126 and the control receiver 148) via one of the remaining traces 162 that is recognized by the state machine 144 as an initialization sequence. The data sequence may be sent and received at a low toggle rate (e.g., a DC rate relative to the data rate of communication in the transmission system 100), which may reduce the risk of signal integrity complications caused by mismatched impedances of the buses in the bus 106.

In a block 208, the transmitting device's state machine sends a wave signal on a designated compensation trace to the target compensation receiver. The wave signal indicates an impedance value of the transmitting device's compensation driver. In one embodiment, the state machine 124 sends a wave signal indicating an impedance value of the compensation driver 120 on the compensation trace 160 to the compensation receiver 142. The wave signal may be transmitted at the same data rate of communication in the transmission system 100 so that AC impedance compensation is at a concomitant transmission system 100 operating bandwidth.

In a block 210, the target state machine samples the wave signal and sends a reply back to the transmitting device. In one embodiment, the state machine 144 samples the wave and sends a reply back to the transmitting device 102 via the remaining traces 162 (through the control driver 146 and the control receiver 128).

In a block 212, the transmitting device acknowledges the reply, changes the impedance value of its compensation driver, and the transmitting device's state machine sends a new wave signal indicating the new impedance value on a designated compensation trace to the target compensation receiver. In one embodiment, the device 102 acknowledges the reply, changes the impedance of the compensation driver 120, and the state machine 124 sends a new wave signal to the compensation receiver 142 via the compensation trace 160.

In a block 214, the target state machine samples the new wave signal and sends a reply indicating whether the new impedance value is higher or lower than the impedance value represented by the previously sampled wave signal back to the transmitting device. In one embodiment, the state machine 144 samples the wave and sends a reply back to the device 102 via the remaining traces 162.

Measuring impedance mismatch, e.g., determining whether the new impedance value is higher or lower than the impedance value represented by the previously sampled wave signal, may be accomplished in several ways. For example, one way would be to could incorporate the generation and receiving of a specific waveform shape such as a sine wave, triangle wave, saw-tooth wave, impulse wave, or data pattern. The impedance match optimization would be manifested and measured though a characteristic of the received wave such as voltage, current, frequency spectrum, amplitude, edge rate, or total power. In this instance, the impedance mismatch may be sensed from the received waveform by integrating the total voltage, iterating different sampling values, triggering a counter, converting analog to digital, or comparing the impedance mismatch against a reference. Depending upon the type of wave signal utilized, the waveform may be periodic or it may vary to introduce intersymbol interference (ISI) or data pattern dependency.

In a block 216, based on the reply from the target state machine, the transmitting device determines whether its state machine has selected a predetermined impedance value taking into consideration the interfaces between the transmitting device and the target device. If the predetermined impedance value has not been selected, the blocks 212 and 214 are repeated until the transmitting state machine determines that the predetermined impedance value has been selected for the device 102. In one embodiment, the predetermined impedance value is an optimum impedance value for the compensation driver 120.

If the predetermined impedance value has been selected, in a block 218 the transmitting device's state machine turns control over to the target device's state machine, which performs AC impedance compensation on its drivers in a similar fashion.

Blocks 208 through 218 may be repeated until iterations result in predetermined impedance values for devices of interest.

Figure 3:
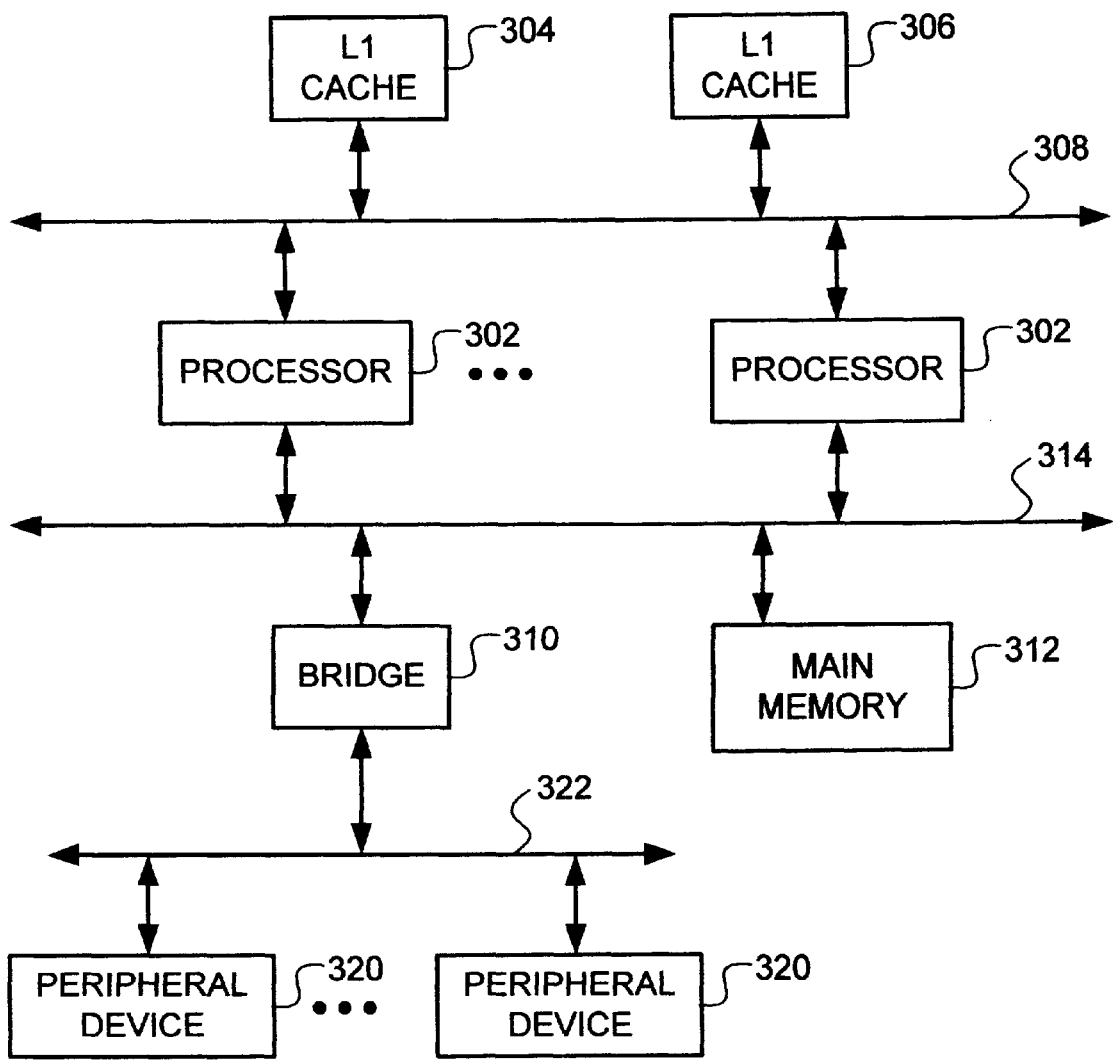
FIG. 3 is a block diagram an example computer system suitable for implementing the example transmission system shown in FIG. 1.

FIG. 3 is a block diagram of an example computer system 300 suitable for implementing the transmission system 100. The computer system 300 includes several devices coupled to each other via several buses. For example, the computer system 300 include several processors 302 coupled to a first level cache (L1 Cache 304) and a second level cache (L2 Cache 306) via a bus 308, and coupled to a bridge 310 and a main memory 312 via a bus 314. The bridge 310 is coupled to several peripheral devices 320 via a bus 322. According to an embodiment of the present invention, any of the devices in the computer system 300 may be a device 102 or a device 104. Additionally, any of the buses in the computer system 300 may be the bus 106.

There are several advantages over the prior art of implementing the impedance compensation of according to embodiments of the present invention. For example, in most prior art digital and analog schemes, impedance is compensated at DC against a fixed resistor. Digital compensation requires a state machine to select output driver legs and provide impedance matching. The binary or linear weighted legs are free running or selected during initialization. Disadvantages of prior art digital compensation include the large die area, state machine to determine the correct bit select settings, and routing of the control signals. Analog compensation requires no state machine or driver legs so control signal routing is simplified. However, disadvantages include the noise sensitivity of bias voltages as well as the size of the stacked compensation device in series with the driver. Moreover, DC impedance compensation schemes do not consider AC impedance or the impedances of other interfaces in a transmission path between devices.

One feature of embodiments of the present invention compensates for AC impedance. Another feature of embodiments of the present invention compensates for fixed AC impedance mismatches, such as those due to process variations.

Still another feature of embodiments of the present invention compensates for AC impedance tolerance mismatch of interfaces in the transmission path of two devices (e.g., printed circuit boards, cards, cables, connectors). In this manner AC impedances of drivers and receivers may be matched considering the same active and passive components that the bus signals see.

Another feature of embodiments of the present invention is that AC compensation for impedance tolerance mismatch requires no prior knowledge of component configuration and tolerances. The AC impedances of drivers and receivers can be matched automatically during power-up, in response to a reset condition, or on demand during bus normal operation.

Still another feature of embodiments of the present invention is that devices require no additional package pins to implement AC impedance matching. Similarly, interfaces in the transmission path (e.g., printed circuit boards, cards, cables, connectors) require no additional traces to implement AC impedance matching. The AC compensation circuitry may share existing traces and pins. An existing trace and pin are used for compensation during initialization and/or during a special sequence. The same trace and pin are used for data transmittal during normal operation.

Aspects of the invention can be implemented using hardware, software, or a combination of hardware and software. Such implementations include state machines, application specific integrated circuits (ASICs), field programmable gate arrays, (FPGA), etc. In implementations using software, the software may be stored on a computer program product (such as an optical disk, a magnetic disk, a floppy disk, etc.) or a program storage device (such as an optical disk drive, a magnetic disk drive, a floppy disk drive, etc.).

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A system, comprising:
   a first printed circuit board;
   a transmission path; and
   a second printed circuit board coupled to the first printed circuit board via the transmission path, the first and second printed circuit boards each having logic to compensate for alternating current (AC) values of the first printed circuit board to match AC impedance values of the second printed circuit board and the transmission path.

2. The system of claim 1, wherein the transmission path includes a bus and a first connector coupled between the first printed circuit board and the second printed circuit board.

3. The system of claim 2, wherein the transmission path further includes a second connector coupled between the bus and the second printed circuit board.

4. The system of claim 1, wherein the logic on the first and second printed circuit boards each comprises a first and second state machine, respectively, the first state machine to transmit a data sequence to the second state machine via one or more control traces on the transmission path.

5. The system of claim 4, wherein the first state machine is to send a set of wave signals via a compensation trace on the transmission path to be sampled by the second state machine, the set of wave signals to indicate a set of impedance values of a first printed circuit board compensation driver, the second state machine to send a set of reply signals to the first state machine via the control traces to indicate a relationship between any two successive wave signals in the set of wave signals.

6. The system of claim 5, wherein the wave signal comprises at least one of a sine wave, a triangular wave, a saw tooth wave, an impulse wave, or a data pattern.

7. The system of claim 5, wherein the relationship between any two successive wave signals is determined based on a characteristic of the set of wave signals, the characteristic comprising at least one of a voltage, a current, a frequency spectrum, an amplitude, an edge rate, or a total power.

8. The system of claim 5, wherein a first wave signal in the set of wave signals is to indicate a default impedance value of the first printed circuit board compensation driver.

9. The system of claim 4, wherein the logic on the first and second printed circuit boards each comprises an input pin coupled to receive a signal to enable the logic to compensate for alternating current (AC) values of the first printed circuit board to match AC impedance values of the second printed circuit board and the transmission path.

10. A system, comprising:
    a first device;
    a transmission path; and
    a second device coupled to the first device via the transmission path, the first and second devices each having logic to adjust alternating current (AC) values of the first device to match AC impedance values of the second device and the transmission path.

11. The system of claim 10, wherein the transmission path includes a bus and a first connector coupled between the first and second devices.

12. The system of claim 11, wherein the transmission path further includes a second connector coupled between the bus and the second device.

13. The system of claim 10, wherein the logic on the first and second devices each comprises a first and second state machine, respectively, the first state machine to transmit a data sequence to the second state machine via one or more control traces on the transmission path.

14. The system of claim 13, wherein the first state machine is to send a set of wave signals via a compensation trace on the transmission path to be sampled by the second state machine, the set of wave signals to indicate a set of impedance values of a first device compensation driver, the second state machine to send a set of reply signals to the first state machine via the control traces to indicate a relationship between any two successive wave signals in the set of wave signals.

15. The system of claim 14, wherein the wave signal comprises at least one of a sine wave, a triangular wave, a saw tooth wave, an impulse wave, or a data pattern.

16. The system of claim 14, wherein the relationship between any two successive wave signals is determined based on a characteristic of the set of wave signals, the characteristic comprising at least one of a voltage, a current, a frequency spectrum, an amplitude, an edge rate, or a total power.

17. The system of claim 14, wherein a first wave signal in the set of wave signals is to indicate a default impedance value of the first device compensation driver.

18. The system of claim 13, wherein the logic on the first and second devices each comprises an input pin coupled to receive a signal to enable the logic to adjust alternating current (AC) values of the first device to match AC impedance values of the second device and the transmission path.

19. A method, comprising:
    transmitting a first wave signal via a first trace on a transmission path to a target device, the first wave signal to indicate a first impedance value for a driver on the transmission path and receiving a first reply signal from the target device via at least one secondary trace on the transmission path;

transmitting a second wave signal via the first trace to the target device, the second wave signal to indicate a second impedance value for the driver and receiving a second reply signal from the target device via the secondary trace to indicate a relationship between the first wave signal and the second wave signal; and transmitting a third set of wave signals to the target device via the first trace to indicate a third set of impedance values of the driver and receiving a third set of replies from the target device until a reply in the third set of replies indicates that a predetermined impedance value for the driver is obtained.

20. The method of claim 19, wherein transmitting the first wave signal, the second wave signal, and the third set of wave signals via the first trace on the transmission path comprises transmitting the first wave signal, the second wave signal, and the third set of wave signals via a first trace through a bus and at least one connector coupled between the driver and the target device.

21. The method of claim 20, wherein transmitting the first wave signal, the second wave signal, and the third set of wave signals comprises transmitting at least one of a sine wave, a triangular wave, a saw tooth wave, an impulse wave, or a data pattern.

22. The method of claim 19, further comprising sending a data sequence to the target device via the secondary traces to initialize the target device.

* * * * *